US006759702B2

(12) United States Patent
Radens et al.

(10) Patent No.: US 6,759,702 B2
(45) Date of Patent: Jul. 6, 2004

(54) MEMORY CELL WITH VERTICAL TRANSISTOR AND TRENCH CAPACITOR WITH REDUCED BURRIED STRAP

(75) Inventors: Carl J. Radens, LaGrangeville, NY (US); Ramachandra Divakaruni, Ossining, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/261,559

(22) Filed: Sep. 30, 2002

(65) Prior Publication Data

US 2004/0061161 A1 Apr. 1, 2004

(51) Int. Cl.[7] .............................................. H01L 27/108
(52) U.S. Cl. ...................................... 257/302; 257/330
(58) Field of Search .......................... 257/60, 301–305, 257/328–334; 438/156, 206, 209, 212, 268, 386–392

(56) References Cited

U.S. PATENT DOCUMENTS

| | | | |
|---|---|---|---|
| 6,281,068 B1 * | 8/2001 | Coronel et al. | 438/243 |
| 6,281,539 B1 * | 8/2001 | Mandelman et al. | 257/302 |
| 6,288,422 B1 | 9/2001 | Mandelman et al. | 257/301 |
| 6,339,241 B1 | 1/2002 | Mandelman et al. | 257/301 |
| 6,426,526 B1 | 7/2002 | Divakaruni et al. | 257/302 |
| 2002/0066917 A1 * | 6/2002 | Jaiprakash et al. | 257/301 |

OTHER PUBLICATIONS

U. Gruening et al., "A Novel Trench DRAM Cell with a VERtIcal Access Transistor and BuriEd Strap (VERI BEST) for 4Gb/16Gb," 1999 IEEE, *IEDM 99–25*, pp. 2.1.1 to 2.1.4.

C. J. Radens et al., "An Orthogonal 6F2 Trench–Sidewall Vertical Device Cell for 4Gb/16Gb DRAM," *Proceedings of IEDM*, San Francisco, CA, Dec. 10–13, 2000, pp. 15.1.1 to 15.1.4.

T. Rupp et al., "Extending Trench DRAM Technology to 0.15αm Groundrule and Beyond," 1999 IEEE, *IEDM 99–33*, pp. 2.3.1 to 2.3.4.

* cited by examiner

*Primary Examiner*—Wael Faboring
*Assistant Examiner*—Marcos D. Pizarro-Crespo
(74) *Attorney, Agent, or Firm*—Joseph P. Abate

(57) ABSTRACT

A memory cell structure including a semiconductor substrate, a deep (e.g., longitudinal) trench in the semiconductor substrate, the deep trench having a plurality of sidewalls and a bottom, a buried strap along a sidewall of the deep trench, a storage capacitor at the bottom of the deep trench, a vertical transistor extending down the sidewall of the deep trench above the storage capacitor, the transistor having a diffusion extending in the plane of the substrate adjacent the deep trench, a collar oxide extending down another sidewall of the deep trench opposite the capacitor, shallow trench isolation regions extending along a surface of the substrate in a direction transverse to the sidewall where the vertical transistor extends, a gate conductor extending within the deep trench, a wordline extending over the deep trench and connected to the gate conductor, and a bitline extending above the surface plane of the substrate having a contact to the diffusion between the shallow trench isolation regions. The deep trench has a perimeter in a direction normal to its depth, and the buried strap extends a distance along the perimeter, the distance being only within a range of 5% to 20% of the entire linear distance along the perimeter, and being less than one lithographic feature size. Preferably, the strap in a direction along the perimeter is curved and is disposed along only one corner of the perimeter. The structure is particularly useful for a sub-8F$^2$ cell.

11 Claims, 10 Drawing Sheets cross section view of word line and deep isolation

Trench pattern layout cut mask (cm) strip pattern

Wordline/isolation pattern

STI/bitline pattern bitline schematic trench formation cross section view capacitor formation vertical transistor formation

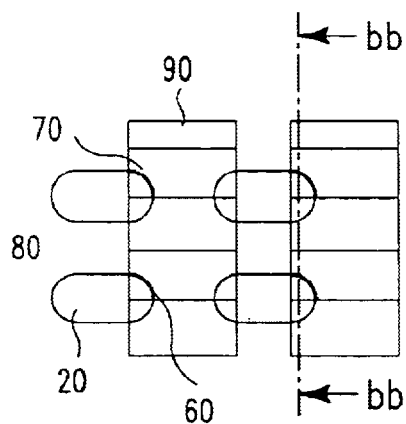
FIG. 10A
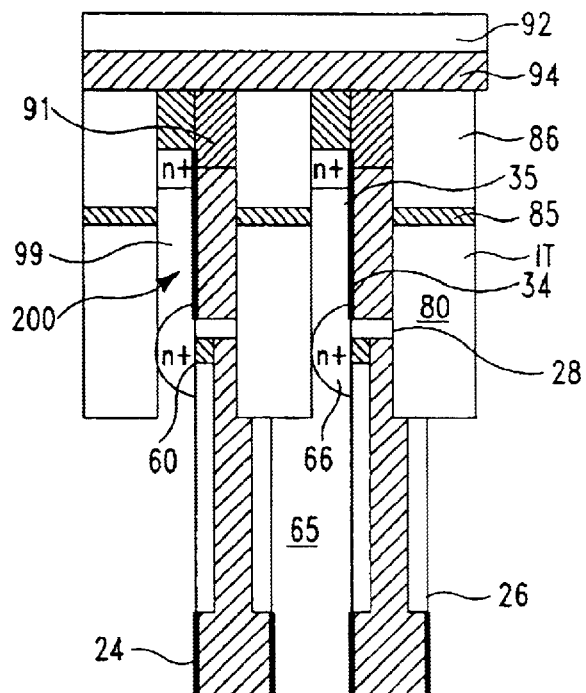
FIG. 10B
cross section view of word line and deep isolation
FIG. 10
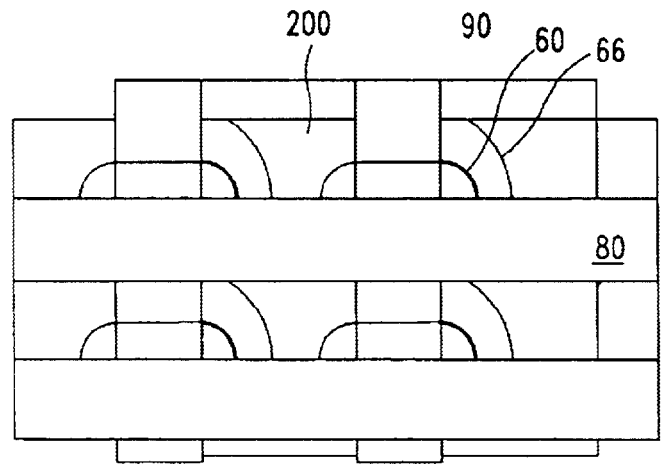
top-down view of cells
FIG. 11

PROCESS FLOW:

MEMORY CELL WITH VERTICAL TRANSISTOR AND TRENCH CAPACITOR WITH REDUCED BURRIED STRAP

FIELD OF THE INVENTION

The present invention relates to semiconductor memory structures and, more particularly, to memory structures having vertical transistors and trench capacitors with buried straps.

BACKGROUND OF THE INVENTION

Semiconductor memory structures including vertical transistors and trench capacitors with buried straps along all side walls or only one side wall of a deep trench (DT) are known. See, for example, U.S. Pat. Nos. 6,288,422; 6,339,241; and U.S. Pat. No. 6,426,526, entitled "Single Sided Buried Strap," by Divakaruni et al., filed May 30, 2001, which are all incorporated in their entireties herein by reference. See also the publications: U. Gruening et al., "A Novel Trench DRAM Cell with a VERtIcal Access Transistor and BuriEd Strap (VERI BEST) for 4 Gb/16 Gb," 1999 IEEE, *IEDM* 99-25, pps. 2.1.1 to 2.1.4; C. J. Radens et al., "An Orthogonal 6F$^2$ Trench-Sidewall Vertical Device Cell for 4 Gb/16 Gb DRAM," *Proceedings of IEDM*, San Francisco, Calif., Dec. 10–13, 2000, pps. 15.1.1 to 15.1.4; and T. Rupp et al., "Extending Trench DRAM Technology to 0.15 μm Groundrule and Beyond", 1999 IEEE, *IEDM* 99-33, pps. 2.3.1 to 2.3.4, which all are also, incorporated in their entireties herein by reference.

In a figure of the '241 patent, as reproduced in FIG. 13 herein, there is shown a cross-sectional view of an embodiment of a known memory cell structure of a type to which the present invention relates. From the '241 patent, FIG. 15 further clarifies FIG. 13. FIG. 14 also clarifies FIG. 13. The memory cell structure 20 illustrated in FIG. 13, FIG. 14 and FIG. 15 is formed in a known manner in a semiconductor substrate. A buried N plate 22 is arranged in the substrate. Deep trenches 24, 26 are formed in the substrate into the buried N plate.

Collar oxide 28 is formed on a sidewall of each deep trench. The collar oxide 28 may extend about the entire deep trench in certain regions of the deep trench as indicated by collar oxide portions 30. Node dielectric 32 is provided on portions of the deep trench walls and collar oxide regions 30. The bottom portion of the trench is filled with N+ doped polysilicon 34.

On top of this region of polysilicon lies trench top oxide region 36. Buried strap 37 is arranged as shown in FIG. 13 and 14, between the collar oxide region 36 and the trench top oxide 36. The strap 37 includes doped polysilicon. A buried strap out diffusion 38 lies adjacent to the trench top oxide region and part of the collar oxide region 30. The strap (heavy line 37 of FIG. 15) extends along a distance of the perimeter of the deep trench 26, the distance being approximately 25% (i.e., approx. one lithographic feature size F) of the entire trench 26 perimeter P lying in a plane parallel to the plane of FIG. 1. The plane in which the trench perimeter P lies is also normal to the depth direction of the trench 26.

Portions of the deep trench above the trench top oxide region 36 are also filled with N+ doped polysilicon 40, which serves as a gate conductor. Gate oxide 42 is provided between the N+ doped polysilicon 40 region and the wall of the deep trench.

P-type channel doping profile (VA/P) regions 44 for the channel of the vertical MOSFET lie adjacent to the portion of the deep trench down to the level of the bottom of the N+ doped polysilicon regions 40. N+(XA/N+) regions 46, which define the bitline contact diffusion, lie above VA/P regions 44 adjacent to the deep trench regions illustrated in FIG. 13, while XA region 48 lies above the VA/P region 44 between the two deep trenches 24, 26 in the embodiment illustrated in FIG. 13.

Tungsten and silicon regions 52 overlie the top of the deep trenches 24, 26. On top of and adjacent to sides of the tungsten and polysilicon regions 52 lie Si$_3$N$_4$ regions 54. Nitride liner 56 merges into nitride spacer/sidewall oxide region 58 adjacent to sides of the tungsten and polysilicon and Si$_3$N$_4$ regions 54 as well as overlying the Si$_3$N$_4$ regions 54.

Borophosphosilicate glass (BPSG) regions 60 overlie the nitride liner. Overying the BPSG and nitride spacer/sidewall oxide region 58 is a layer of tetraethyl ortho silicate (TEOS) 62.

Contact-to-bitline (CB) polysilicon regions 64, which provide a conductive stud between bitline contact diffusion XA and bitline metal MO 68, extend out through the TEOS and BPSG layers to the level of XA regions 48, 46. CB TEOS liner regions 66 surround the CB polysilicon region 64. The bitline metal/metal level 0 (MO) 68 overlies portions of the TEOS layer 62 as well as the CB polysilicon and CB TEOS liner regions 164 and 66.

The process for forming the memory cell structure of FIGS. 13. 14 and 15 is well known from, for example, U.S. Pat. No. 6,339,241, "Structure and Process for 6F$^2$ Trench Capacitor DRAM Cell with Vertical MOSFET and 3F Bitline Pitch", issued Jan. 15, 2002, by Mandelman et al. (hereinafter '241 patent), and need not be further discussed.

The continued scaling of advanced trench-capacitor-sidewall transistor memory (e.g., DRAM) cells is constrained by the electrical interaction between adjacent memory elements, and exacerbated by decoupling of the array well from a V$_{bb}$ supply.

An adjacent wordline disturb mechanism, and a strap-to-strap interaction mechanism, have been identified by the present inventors as scaling limitations for back-to-back trench-capacitor sidewall transistor DRAM cells sharing a single bitline diffusion in the sub-90 nm groundrule generations.

OBJECT OF THE INVENTION

The known memory cell structure such as shown in the '241 patent or in U.S. Pat. No. 6,288,422, may continue to exhibit undesirable strap-to-strap interaction can be minimized further.

Also, the process for forming the buried strap can be improved.

It is a principal object of the present invention to reduce strap-to-strap interaction over that interaction known in the prior art.

It is a further object of the present invention to confine the buried strap to a distance along the circumference of the deep trench which is substantially less than the known distance.

It is an additional object of the present invention to reduce the interaction between adjacent transistors caused by the extent of buried strap out diffusion over that known in the prior art.

It is an additional object of the present invention to improve a process for forming the buried strap.

SUMMARY OF THE INVENTION

According to the present invention, a memory cell structure includes a semiconductor substrate, a deep trench in the semiconductor substrate, the deep trench having a plurality of sidewalls and a bottom, a storage capacitor at the bottom of the deep trench, a vertical transistor extending down a sidewall of the deep trench above the storage capacitor, the transistor having a diffusion extending in the plane of the substrate adjacent the deep trench, a collar oxide extending down the sidewall of the deep trench opposite the storage capacitor, shallow trench isolation regions extending along a surface of the substrate in a direction transverse to the sidewall where the vertical transistor extends, a gate conductor extending within the deep trench, a wordline extending over the deep trench and connected to the gate conductor, and a bitline extending above the surface plane of the substrate having a contact to the diffusion between the shallow trench isolation regions, and a buried strap along the sidewall of the deep trench, wherein the deep trench has a perimeter lying in a plane oriented in a direction normal to its depth, and the buried strap extends a distance along the perimeter, the distance being only within a range of 5% to 20% of the entire linear distance of the perimeter, and less than one lithographic feature size F. Preferably, the strap in a direction along the perimeter is curved and is disposed along only one corner of the perimeter. The corner lies, for example, within a sector of an imaginary closed curve containing the corner, the sector being defined by two radii separated by greater than 0° and not greater than 90°.

According to the present invention, the buried strap (capacitor contact) is formed by the novel application of two separate patterning steps, and hence the extent of the impurity dopant out diffusion from the buried strap is reduced relative to sub-$8F^2$ prior art. The reduced out diffusion (n+ region) in proximity to the adjacent cell reduces the interaction between adjacent cells and enables a scaling reduction relative to sub-$8F^2$ prior art (e.g., '241 patent).

A novel dielectric isolation between adjacent rows is provided by merging the isolation trench (H) and wordline (WL) structure using a damascene wordline process.

The strap delineation and wordline/isolation masking levels are simple line/space patterns.

Further and still other objects of the present invention will become more readily apparent in view of the following detailed description in conjunction with the drawing figures.

BRIEF DESCRIPTION OF THE DRAWINGS

FIGS. 6–11 are cross-sectional and top-down schematic views which further clarify the location and confinement of the buried strap 60 and the buried strap out diffusion region 66.

DETAILED DESCRIPTION OF PREFERRED EMBODIMENT AND BEST MODE

The present invention will now be described in more detail as shown in FIGS. 1–12. Effecting each structure and step as shown in FIGS. 1–12 and 16 and described and/or claimed herein is well understood to those skilled in the art, in view of the instant specification and figures. The memory cell structure and individual steps of the process for forming the structure are similar in many respects to those for forming the structure of FIG. 13. Accordingly, substantially only those portions of the memory cell structure directed to the inventive aspects of the present invention will be discussed in detail.

The memory cell structure of the present invention is particularly beneficial for forming sub-$8F^2$ structures, where F is a characteristic lithographic feature size, such as a size F within a range of 50 nm$\leq$F$\leq$100 nm. According to an aspect of the present invention, the buried strap can be confined to a size of approximately (±30%) one-half F.

Figure 16:
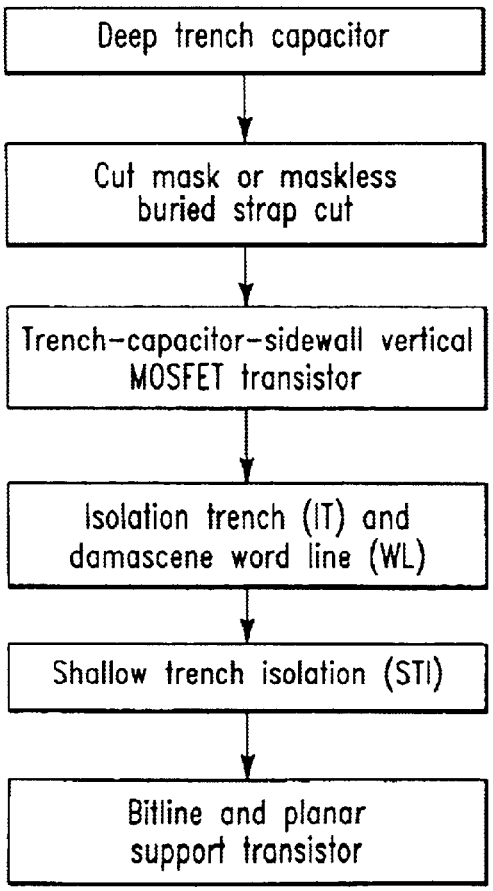
FIG. 16 is a list of various preferred process steps to effect the structure of FIG. 9B and FIG. 10B.

Preferred Embodiment:

A description of the inventive memory cell structure (e.g., FIG. 5 FIG. 9B, FIG. 10B) will first be given for the novel arrangement of structural elements (including the strap) as a cell layout in the first set of FIGS. 1–5, and as cross-sectional and top views of the resulting memory elements in the next set of FIGS. 6–12. FIG. 16 lists various process steps to form the structure (FIG. 5, FIG. 9B, FIG. 10B) according to the present invention In this embodiment, the trenches 20 are substantially elliptic, but can be other oblong shapes or even circular or square-shaped or rectangular-shaped as formed by crystallographic wet etching.

Figure 1:
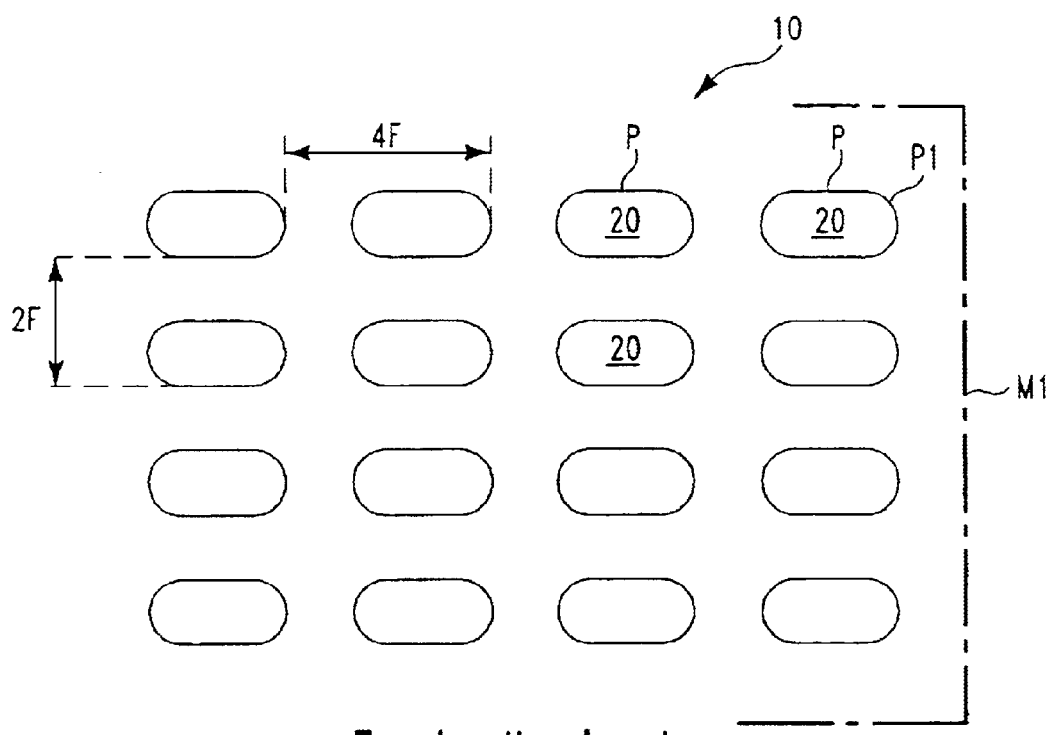
FIGS. 1–4 are top-down schematic views of intermediate structures and intermediate steps.

A top-down or plan view of a trench array is shown schematically in FIG. 1. A semiconductor substrate 10, such as single-crystal silicon, silicon-on-insulator (SOI), III-V compound, or other suitable material, is patterned into an array of trenches 20 using conventional microelectronics processing techniques. The trenches 20 are formed (e.g., patterned) using standard processing techniques such as photolithography and reactive ion etching as described by T. Rupp et al. IEDM 1999 or the '241 patent, and well known to those skilled in the art. For example, the trenches 20 are patterned using a mask M1 which is subsequently removed (e.g., etched). Each trench 20 includes a perimeter P having a portion P1 (e.g., curved). The portion P1 has a primary radius of curvature R which forms an imaginary circle C (see FIG. 12) having a circumference C containing the portion P1.

Figure 2:
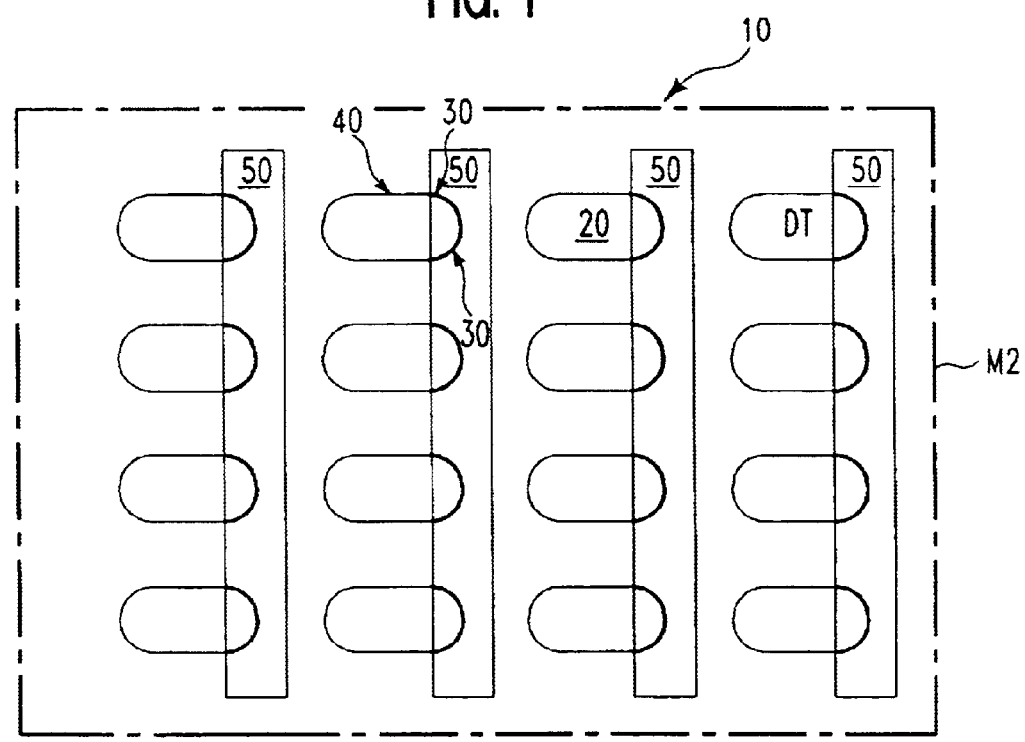

FIG. 2 shows the application of a cut mask (CM) stripe pattern 50 of mask M2 which serves to delineate each trench 20 into a strap region 30 and a non-strap region 40. The strap region 30 will serve as an electrical connection between a trench capacitor inner storage electrode 24 in FIGS. 7 and 8, and the substrate 10 as will be hereinafter apparent. As will be understood to those skilled in the art, the strap region 30 includes a suitably doped polysilicon disposed (e.g., deposited) within the trench 20.

The strap region 30 is localized onto a region of the trench 20 using the cut mask pattern 50 of the mask M2. The cut mask pattern 50 and the strap region 30 are formed using well known combinations of photolithography, wet etch, dry etch, ion implantation and thin film deposition. The cut mask stripe pattern 50 is an opening in a masking layer such as a photoresist or an oxide M2. Alternatively, a maskless process can be used to form the regions 30, 40 such as angled ion implantation and selective etching.

Figure 3:
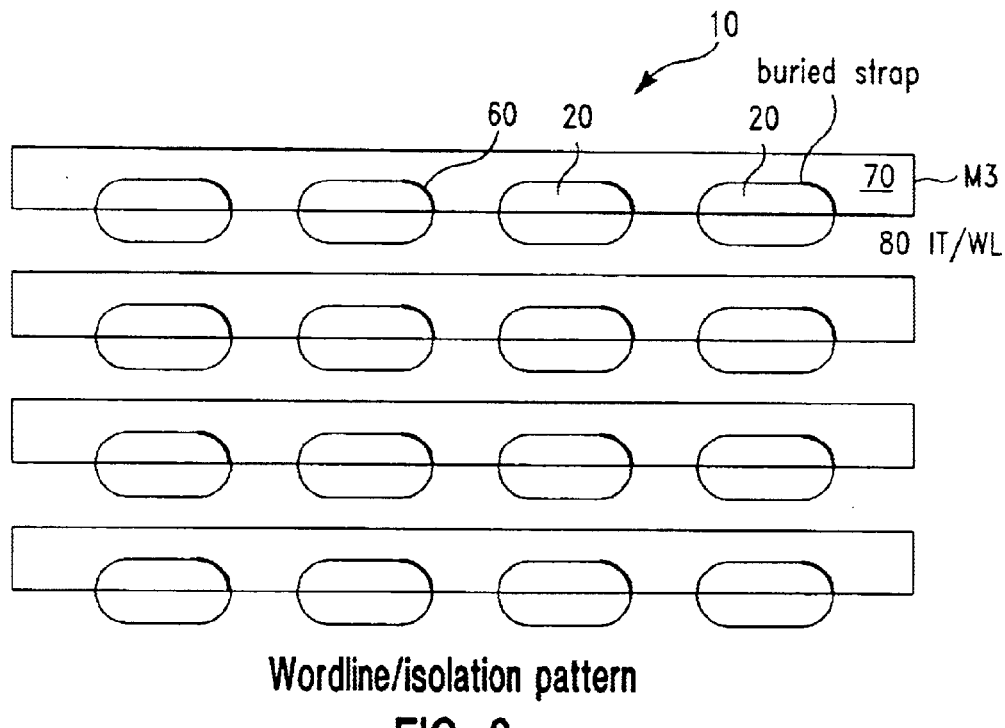
Figure 15:
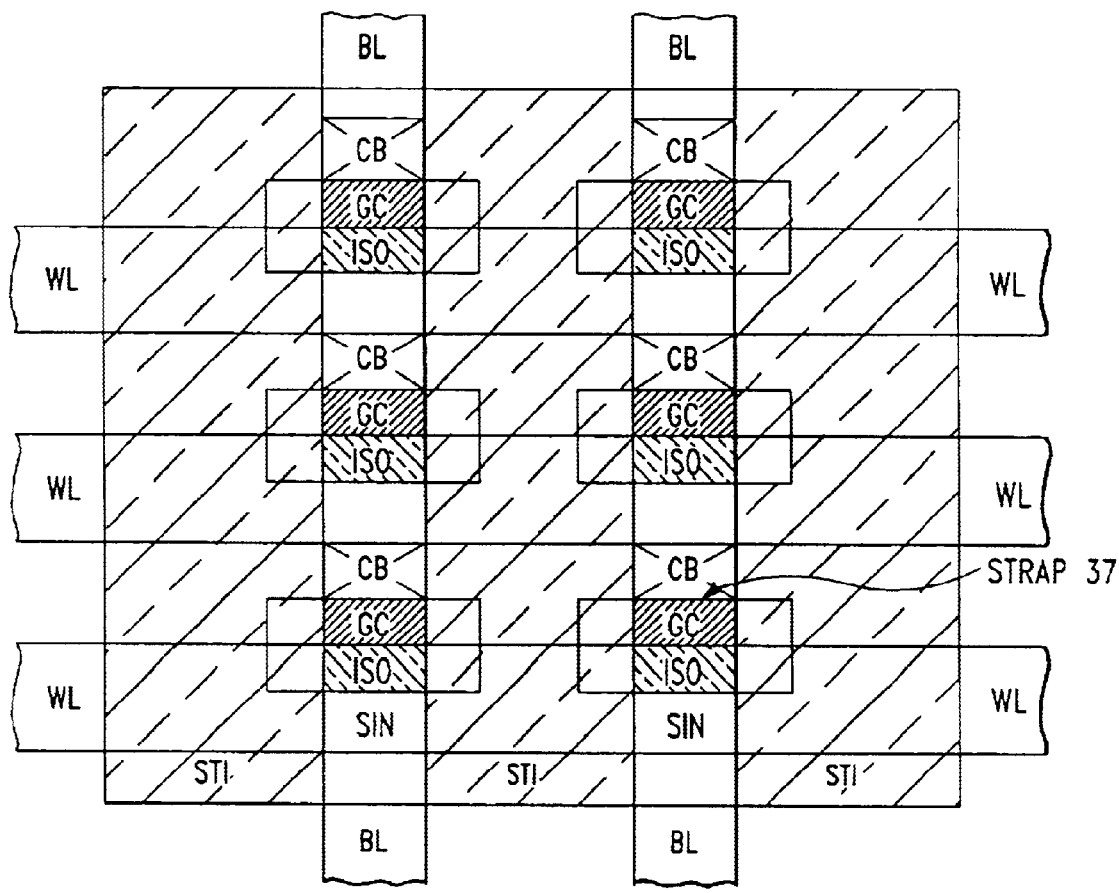
FIG. 15 is a top schematic view of the prior art structure shown in FIG. 13 and FIG. 14.

In FIG. 3, the wordline/isolation stripe pattern has been formed into the array which results in regions of active area 70 and wordline/isolation area 80. Forming the active area 70 includes conventional masking with a hard mask (outline of which is labeled as M3). However, according to the present invention, the mask M3 further delineates each strap region 30, so that each buried strap 60 is confined (after removing the polysilicon from part of the region 30) to a portion of each trench 20. According to the present invention, the active area 70 is elongated in a direction substantially normal to the elongated direction (parallel to 8L in FIG. 15) of the active area in the '241 patent. As shown in FIG. 1 and FIG. 3, each strap 60 has a perimeter (heavy line) which lies along a portion P1 of the perimeter P of its respective trench 20. The wordline/isolation regions 80 provide electrical isolation between the adjacent rows of vertical transistors formed on the trench sidewalls, and serve as a cutout region for the formation of the array wordlines using a known or conventional damascene inlay process. The wordline/isolation stripes thus perform the dual purpose of providing electrical isolation between adjacent buried straps, and as a wordline for row addressing in the memory array.

Figure 4:
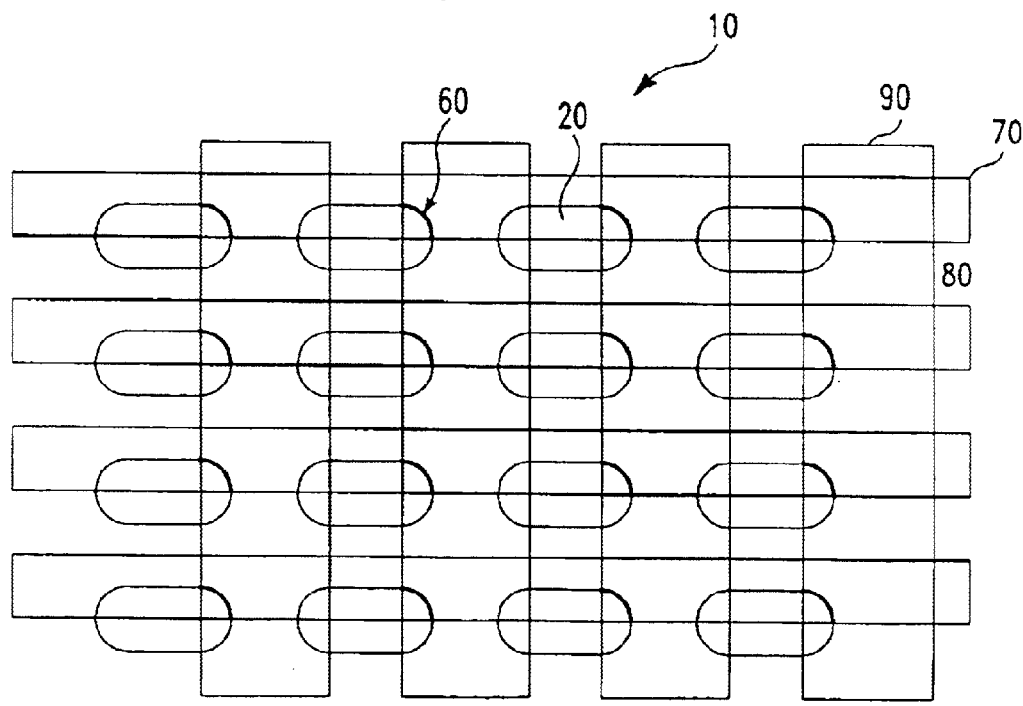

FIG. 4 shows a top-down view of the array with the addition of an STI/bitline pattern 90 which serves to provide shallow trench isolation (STI) 81 between upper source/drain regions of the vertical transistors and a wiring level for the column access of the memory array (bitline). The bitlines 100 are shown schematically in FIG. 5. STI/bitline pattern 90 is formed, e.g., as described in U.S. Pat. No. 6,339,241.

Figure 5:
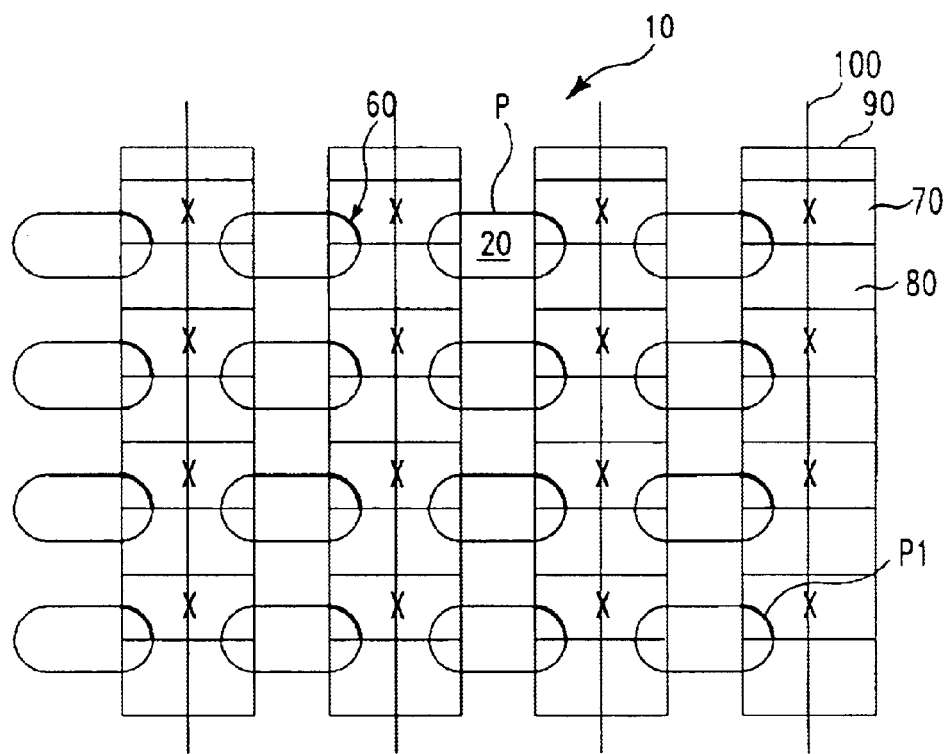
FIG. 5 is a top-down schematic view of a final structure and final step, of a preferred embodiment of the present invention, showing the inventive reduction and confinement of a buried strap 60.
Figure 12:
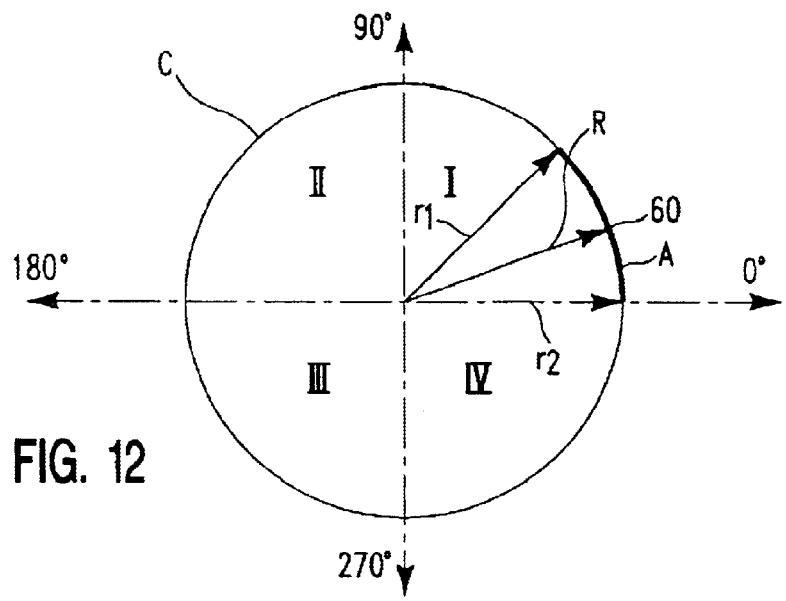
FIG. 12 is a diagram showing a buried strap 60 according to one preferred embodiment of the present invention, the strap being located only within a quadrant (e.g., I) of an imaginary circle C having a radius R corresponding (e.g., equal) to the radius of a curve whose perimeter (e.g., circumference) contains a majority (e.g., greater than 50%) of a perimeter of the buried strap 60. The strap 60 is contained within a sector bounded by the radii $r_1 r_2$ and the enclosed arc A.
Figure 13:
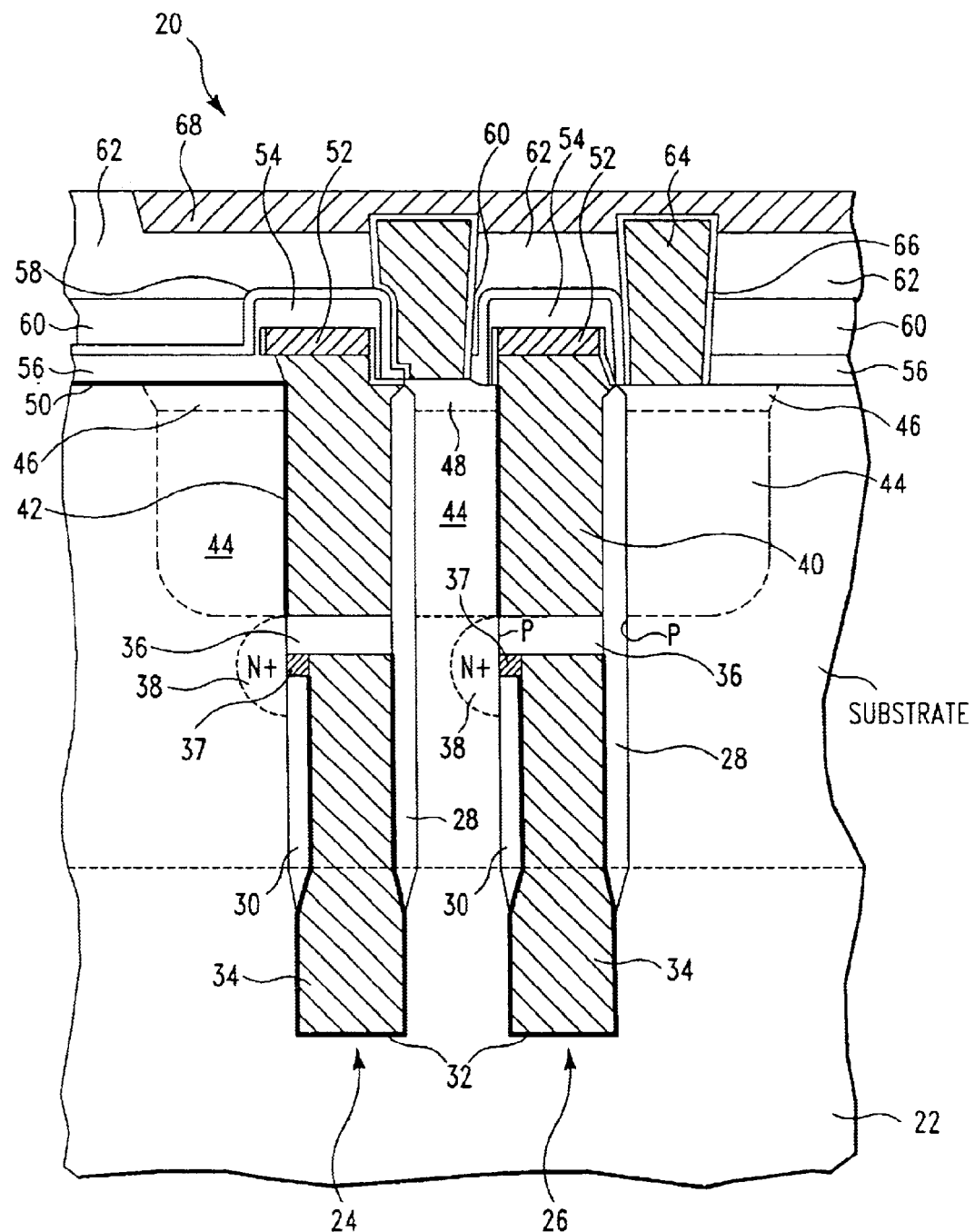
FIGS. 13, 14 are schematic cross-sectional views of a memory structure according to the prior art, having a buried strap less confined than a strap according to the present invention. The numerals used to identify the elements of the structure shown in FIGS. 13–15 do not correspond to the numerals used to identify the elements of the various structures according to the present invention (FIGS. 1–12).
Figure 14:
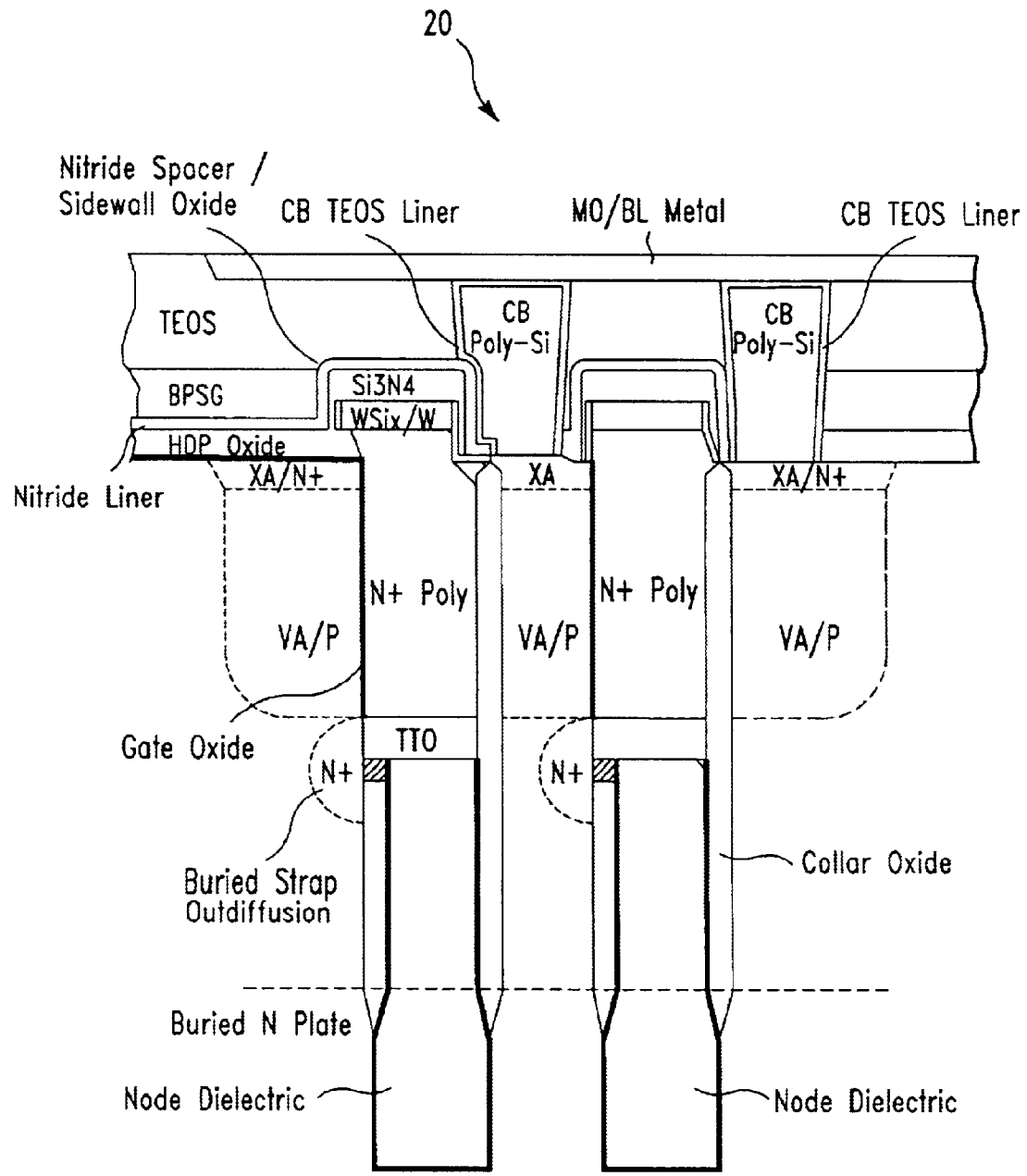

As shown in FIG. 5 and FIG. 12, the buried strap 60 extends a distance along the portion P1 of the perimeter P of the trench 20. The portion P1 is only approximately five percent–20% of the entire distance along the perimeter P, and is less than :one lithographic feature F.

The process flow to form the memory cell structure according to the invention is shown generally in FIG. 16 (top to bottom), and is further described with reference, e.g., to FIGS. 6–12. The nomenclature of FIG. 16 is well understood by those skilled in the art in view of the instant disclosure.

Figure 6:
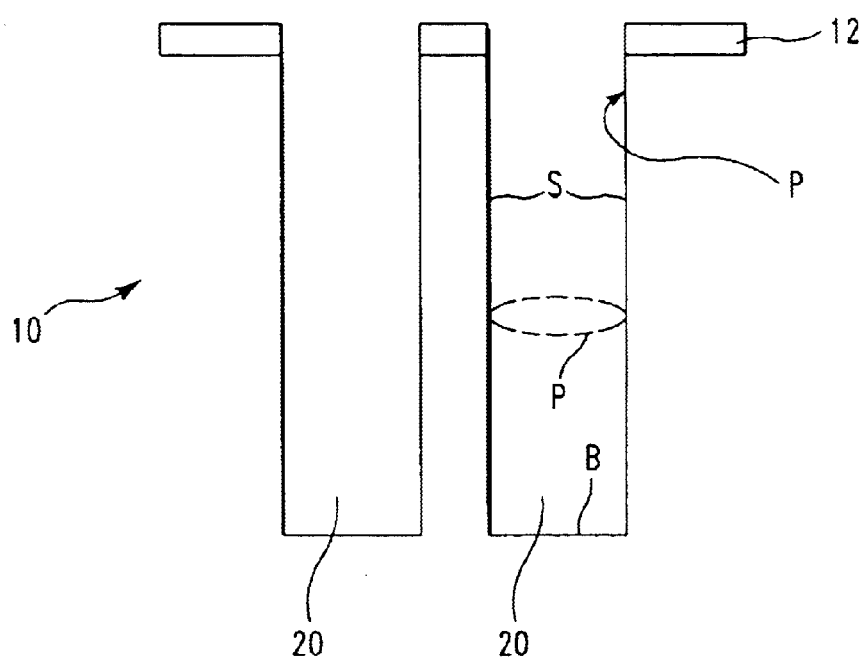

A cross-sectional view of two trenches 20 is shown in FIG. 6 corresponding to FIG. 1. The trenches 20 are formed using conventional photolithography and dry etch such as a reactive ion etching (RIE) using a combination of $Cl_2$/$HBr$/$O_2$/$N_2$/$SF_6$/$He$/$SiCl_4$ gas mixtures to a depth of 2 $\mu$m–10 $\mu$m, preferably 7 $\mu$m. The trenches 20 are formed into the substrate 10 and through a pad film 12 such as 150 nm of low-pt LPCVD SiN. The film 12 corresponds to the mask M1 (FIG. 1). Each trench 20 is formed by a plurality of sidewalls S defining an outer perimeter P of the trench. A bottom wall B is at the bottom portion of the trench 20.

Figure 7:
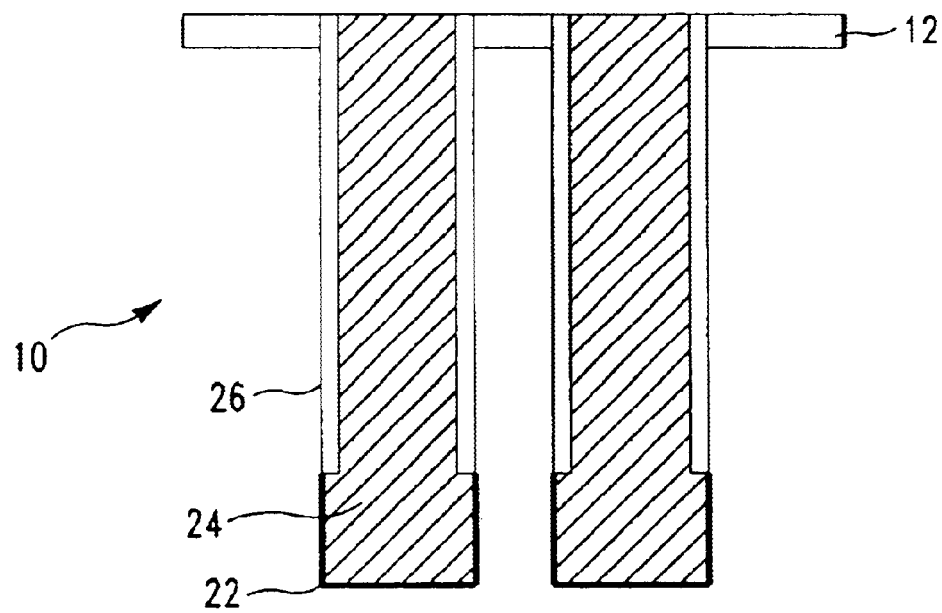

FIG. 7 shows the formation of the capacitor 26, 24, 22, including thin node insulator 22 such as 3.5 nm SiN or high-dielectric constant materials such as AlOx, ZrO, HfO, trench electrode 24 such as As-doped LPCVD polysilicon, Ge-doped polysilicon, or metallic conductor such as TiN, WSi, W, and isolation collar 26 such as 10 nm–50 nm, preferably 30 nm, oxide. A bottle profile and buried plate doping is not shown in the figures, but will be understood to be conveniently applied to the capacitor as described in, e.g., Rupp IEDM 1999, or in the '241 patent.

Figure 8:
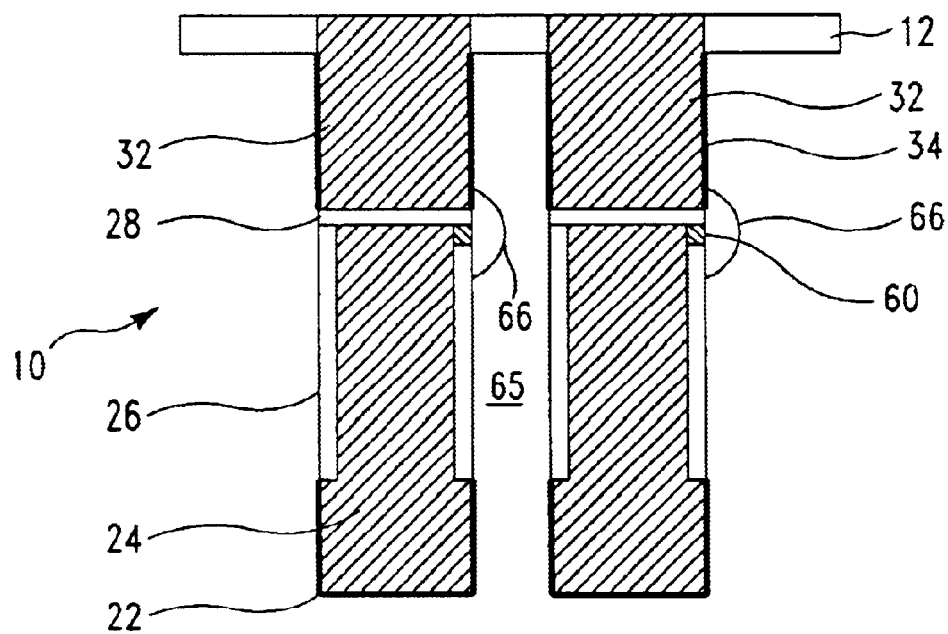

FIG. 8 shows the vertical transistor which includes a trench-top oxide 28 isolation formed using anisotropic deposition high-density plasma (HDP) oxide of thickness 10 nm–50 nm, preferably 30 nm, n+ buried strap source/drain out diffusion 66, 4 nm–7 nm, preferably 5 nm, vertical gate thermal oxide 34, and trench gate electrode or gate conductor 32, such as n+ As-doped or P-doped, or Ge-doped polysilicon. The isolation collar 26 is removed from upper portions of the trench 20 by techniques such as taught in the '526 patent. The buried strap 60 is formed in a region of trench 20 using a stripe mask 50 as described previously (e.g., FIG. 2) in combination with, e.g., processes such as a single-sided strap as taught in the '526 patent. Thus, such techniques and processes need not be fully described. A p-well region 65 is disposed between the trenches and is formed, e.g., by ion implantation.

Figure 9A:
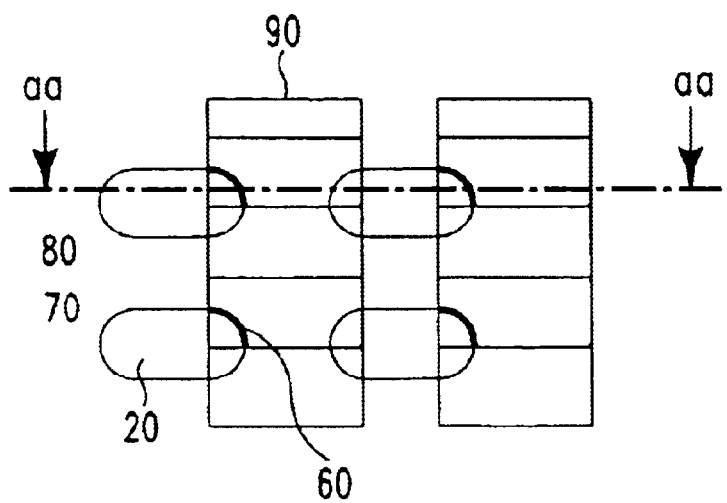
Figure 9B:
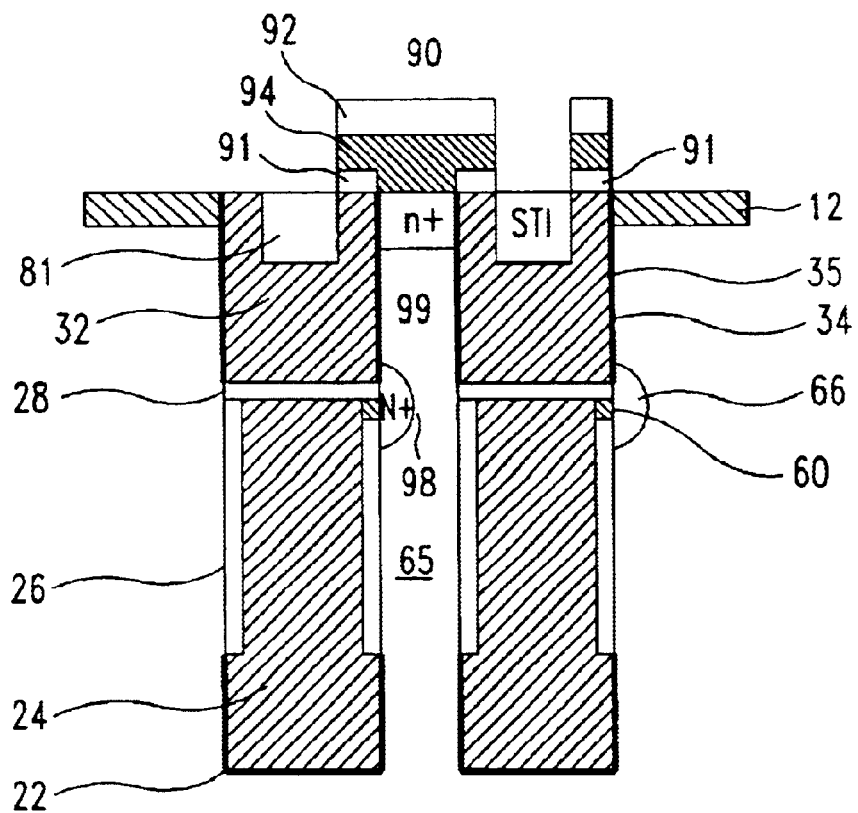

FIG. 9A shows a top-down schematic view, and FIG. 9B shows a cross-sectional view in direction of arrows aa—aa. FIG. 9B shows the shallow trench isolation (STI) 81. FIG. 9B is a cross-sectional view through FIG. 9A of two vertical transistors and capacitors at completion. Element 90 is schematically an isolation trench (IT) and bitline (BT) pattern (e.g., formed conventionally from various masks in well known manner), 94 is a bitline conductor (W), 92 is a cap (e.g., silicon nitride). The STI regions 81 are formed in conventional manner such as taught in the '241 patent.

FIG. 10A shows a top-down schematic view, and FIG. 10B show is a cross-sectional view (in direction of arrows bb), of a completed memory structure having a buried strap 60 and out diffusion region 66 according to the present invention. The trench gate electrode 32 is electrically connected to wordline (WL) conductor 85, and the buried out diffusion 66 is electrically isolated from the adjacent transistor by isolation trench 80. The body of the MOSFET device 200 is electrically isolated from the wordline 85 by application of a maskless process using an angled ion implantation and selective etching as practiced in the formation of the maskless buried strap cut alternative embodiment in FIG. 8.

FIG. 11 is an additional top-down schematic view of the memory structure according to the present invention. The transistor body region 200 reaches beyond the extent of the buried strap out diffusion 66 and hence affords an electrical connection between the vertical MOSFET and the underlayer substrate without interference of the buried strap out diffusion as suffered by known sub-$8F^2$ vertical transistor memory cells.

FIG. 12 is a diagram explaining a preferred orientation of the buried strap 60 of the present invention disposed within a quadrant I of an imaginary circle C having a primary radius R. The buried strap 60 subtends an arc along the circumference of the circle C which is less than one lithographic feature size F in extent Implementing each step described herein (e.g. further listed in FIG. 16) to effect the inventive memory cell structure or an array of such structures is well within the skill of the art in view of the instant specification and drawing figures.

Nevertheless, a part of the preferred process as shown in FIG. 16 and FIGS. 9A, 10A, 9B, 10B, will now be recapitulated for additional clarity.

FIGS. 9A and 10A show top-down views, and FIGS. 9B and 10B show cross-sectional views of the completed inventive array structures.

A preferred process flow sequence is shown in FIG. 16. After completion of the storage capacitor and vertical transistor as shown in FIG. 8, a second pad SiN 91 is deposited by Chemical Vapor Deposition (CVD), the isolation trench (IT) and wordline trench (WL) 81 is formed by photolithography and RIE, the IT/WL trench is partially oxidized to treat the exposed surface of the trench silicon substrate (not shown in the figure), filled with oxide such as high density plasma (HDP) silicon dioxide 80, planarized by CMP and recessed by RIE selective to the pad SiN. A WL conductor 85 such as W is deposited into the trench using Chemical Vapor Deposition (CVD), planarized by CMP, and recessed by RIE to a level as shown in FIG. 10B. A cap oxide 86 is deposited by HDP, and planarized by CMP, to the pad SiN 91. A pair of block level lithographic masks ES (etch support) and EA (etch array) (not shown) are used to deliniate the array and support regions and provide for the formation of transistors in the support regions away from the memory array. A third pad SiN (not shown) is deposited by CVD, and a shallow trench isolation 81 is formed by photolithography, RIE, oxide deposition and CMP as is known to those skilled in the art. A surface n+ source/drain region 35 is formed by ion implantation such as As. A p-well 65 is formed by ion implantation such as B. A bitline conductor material 90 such as W and cap 94 such as SiN is deposited by CVD, and patterned into bitline 90 by photolithography and RIE.

The completed structure cross-section views shown in FIGS. 9B and 10B show the vertical transistor gate electrode 32, which is accessed by the wordline 85. The MOSFET transistor channel 34 is controlled by the electrical potential of the gate electrode 32. The source and drain regions 66, 35 are located at the buried strap out diffusion 66 and at the substrate 10 wafer surface. The vertical transistor channel 34 is used to control charge transfer between the bitline conductor 90 and the storage capacitor electrode 24. The buried strap 60 provides electrical connection between the capacitor electrode 24 and the channel region 34.

As shown in FIG. 9B, the arrangement of the array including the confined buried strap out diffusion 66 provides an unobstructed electrical connection between the p-well 65 and the body 99 of the transistor. The body contact region 98 between the body 99 and the p-well 65 permits an advantageous operation of the MOSFET.

While there has been shown and described what is at present considered a preferred embodiment of the present invention, it will be readily understood by those skilled in the art that various changes and modification may be made therein without departing from the spirit and scope of the present invention which shall be limited only by the scope of the claims.

What is claimed is:

1. A memory cell structure, comprising:

a semiconductor substrate, a deep trench in the semiconductor substrate, the deep trench having a plurality of sidewalls and a bottom, a storage capacitor at the bottom of the deep trench, a vertical transistor extending down a sidewall of the deep trench above the storage capacitor, the transistor having a diffusion extending in the plane of the substrate adjacent the deep trench, a collar oxide extending down the sidewall of the deep trench opposite the storage capacitor, shallow trench isolation regions extending along a surface of the substrate in a direction transverse to the sidewall where the vertical transistor extends, a gate conductor extending within the deep trench, a wordline extending over the deep trench and connected to the gate conductor, a bitline extending above the surface plane of the substrate having a contact to the source diffusion between the shallow trench isolation regions, and a buried strap along the sidewall of the deep trench, wherein the deep trench has a perimeter in a direction normal to its depth, said buried strap extends a distance along said perimeter, the distance being only within a range of 5% to 20% of the entire linear distance along the perimeter and being less than one lithographic feature size, and wherein the buried strap is disposed along only one corner of the perimeter.

2. The memory cell structure as claimed in claim 1, wherein the buried strap has a primary radius of curvature, and the buried strap is disposed only within one sector of a closed curve having the radius of curvature, the sector being greater than 0° and not greater than 90°.

3. The memory cell structure as claimed in claim 1, wherein the structure further includes a buried strap out diffusion region adjacent to the buried strap, the buried strap outdiffusion region being disposed only within one sector of a closed curve containing the buried strap, the sector being within a range of 0°<sector ≦90°.

4. The memory cell structure as claimed in claim 1, wherein the strap is curved.

5. An array of memory cell structures, each cell structure including a structure as claimed in claim 1.

6. The memory cell structure as claimed in claim 1, wherein the trench has a maximum depth in a range of approximately 2 $\mu$m to approximately 10 $\mu$m.

7. The memory cell structure as claimed in claim 1, wherein the buried strap is formed by the steps of:

applying a first mask having an opening;

forming the deep trench through the opening;

applying a second mask having a second opening;

forming a strap region through the second opening;

applying a third mask over a first portion of the strap region, and then removing a second portion of the strap region, so that the first portion consists of essentially the buried strap.

8. The memory cell structure as claimed in claim 7, wherein the second opening is elongated, and wherein the third mask is applied in a direction substantially normal to the elongation of the second opening.

9. A memory cell structure, comprising:

a semiconductor substrate;

a longitudinal trench in the semiconductor substrate, the trench having sidewalls defining an outer perimeter of the trench in directions around its longitudinal axis, the trench having top and bottom portions formed by the sidewalls;

a capacitor disposed at the bottom portion;

a transistor disposed at the top portion over the capacitor;

a buried strap being at a sidewall and being connected to the capacitor;

wherein the buried strap extends a distance along a portion of the outer perimeter of the trench, the distance being only within a range of five percent to 20% of the entire linear distance along the outer perimeter, and wherein the buried strap is disposed along only one corner of the perimeter.

10. The memory cell structure as claimed in claim 9, wherein the wherein the distance is approximately one-half a lithographic feature size.

11. The memory cell structure as claimed in claim 10, wherein the lithographic feature size is a size in a range of 50 nm to 100 nm.

* * * * *